United States Patent [19]
Mertol

[11] Patent Number: 5,940,271
[45] Date of Patent: Aug. 17, 1999

[54] STIFFENER WITH INTEGRATED HEAT SINK ATTACHMENT

[75] Inventor: Atila Mertol, Cupertino, Calif.

[73] Assignee: LSI Logic Corporation, Milpitas, Calif.

[21] Appl. No.: 08/850,076

[22] Filed: May 2, 1997

[51] Int. Cl.⁶ ...................................................... H05K 7/20
[52] U.S. Cl. ...................... 361/704; 361/702; 361/707; 361/709; 165/80.2; 165/80.3; 165/185; 257/706; 257/717; 257/718; 257/719; 257/721; 257/722; 257/787
[58] Field of Search ..................................... 361/697, 702, 361/704, 709, 710, 717, 718, 719; 165/80.2, 80.3; 257/706, 707, 717, 718, 719, 727

[56] References Cited

U.S. PATENT DOCUMENTS

| | | | |
|---|---|---|---|
| 4,323,914 | 4/1982 | Berndlmaier et al. | 257/713 |
| 5,003,429 | 3/1991 | Baker et al. | 361/704 |
| 5,621,615 | 4/1997 | Dawson et al. | 361/704 |

*Primary Examiner*—Leo P. Picard
*Assistant Examiner*—Boris L. Chervinsky

[57] ABSTRACT

An electronic semiconductor device package, the package comprising: a substrate having traces; a die attached to the substrate; first level interconnects of the die to the traces of the substrate; and a stiffener attached to the substrate, wherein the stiffener comprises at least one clip. A system for attaching a heat sink to an electronic semiconductor device package, the system comprising: a stiffener of the electronic package which is attachable to the electronic package; and at least one clip that is integral with the stiffener and secures the heat sink to the stiffener. A method of detachably attaching a heat sink to an electronic semiconductor device package, the method comprising: attaching a stiffener to the package, wherein the stiffener comprises at least one clip; positioning a heat sink adjacent the stiffener; and engaging the clip with the heat sink, wherein the heat sink is secured to the stiffener by the clip.

7 Claims, 7 Drawing Sheets

STIFFENER WITH INTEGRATED HEAT SINK ATTACHMENT

TECHNICAL FIELD

This invention relates to electronic semiconductor packages or assemblies, especially devices for attaching heat sinks to electronic semiconductor packages.

BACKGROUND OF THE INVENTION

Electronic semiconductor packages are well-known and are configured in several different ways. Typically, an electronic semiconductor package includes: a silicon chip (die) containing circuit elements; a substrate, for example, a printed circuit board (PCB); first level interconnects which connect the die and the PCB, i.e., wirebonds, Tape Automated Bonds (TAB) and Controlled Collapse Chip Connection (C4 or flip chip bonds); and second level interconnects, such as external metal pins or solder balls, which connect the substrate to printed wiring circuit cards. Substrates comprise ceramic or plastic materials depending of the particular application. Some semiconductor packages have encapsulant which coats the die and the first level interconnects for protection. A dam or stiffener ring may also be used to hold the encapsulant in place around the die and interconnects as it hardens.

Figure 1:
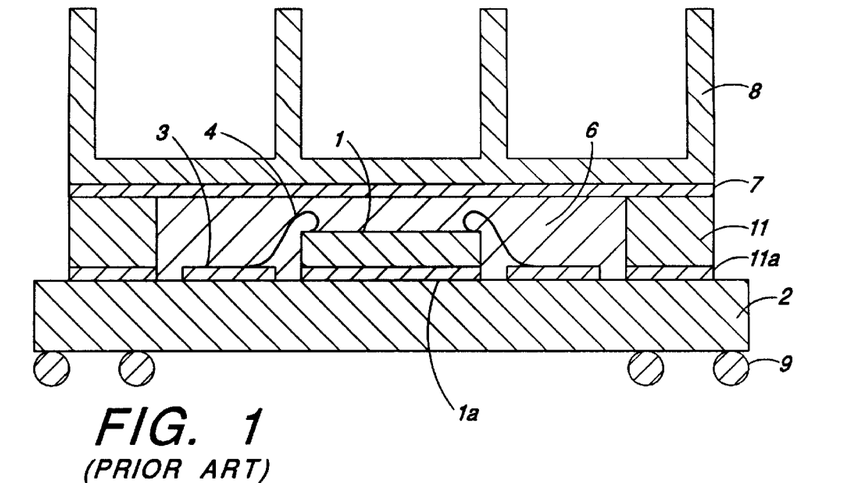
FIG. 1 is a cross-section side view of an electronic semiconductor package with heat sink.

A cross-sectional view of a typical cavity-up electronic semiconductor package is shown in FIG. 1. A semiconductor chip or die 1 is attached to a substrate 2 by die attach epoxy 1a. The die 1 electrically communicates with the traces 3 of the substrate 2 by bond wires 4. A stiffener ring 11 surrounds the die 1 and is attached also to the substrate 2 by epoxy 11a. Encapsulant 6 resides within the stiffener ring 11 and over the die 1 and wirebonds 4. A layer of epoxy 7 is spread over the encapsulant 6 and stiffener ring 11 and a heat sink 8 is attached thereto by the epoxy 7. Solder balls 9 attach the substrate 2 to a printed wiring circuit card, not shown.

During operation, energy is lost in the form of heat which builds up in the electronic semiconductor packages. As junction temperatures increase, reliability and speed are sacrificed. Because failure processes accelerate with increased temperature, the life of each junction becomes shorter as the temperature increases. It is generally well-known to provide means for dissipating heat from the electronic semiconductor package. It is particularly important to dissipate heat from electronic packages with semiconductor devices which operate at high speeds and high power levels.

The path of heat dissipation is considered in two parts: junction-to-case path and case-to-ambient path. The junction-to-case path usually conducts heat directly from the die to a package surface through an encapsulant epoxy. Then the heat is convected from the semiconductor package case to a surrounding ambient (case-to-ambient path) either by natural convection or forced convection. The case-to-ambient heat transfer is enhanced by increasing surface area exposed to ambient air. This is accomplished by employing heat sinks which have many configurations. Fluids such as air, water, etc. are passed over the heat sink to exchange heat from the heat sink surface to the fluid or ambient.

Because the heat dissipation effectiveness of a heat sink is dependent on the thermal resistance of the path between the package and the heat sink, the means of attaching the heat sink to the package is critically important. Typically, heat sinks are constructed from a high thermal conductivity material, such as copper, aluminum or high thermal conductivity plastic. They are attached to the packages with thermally conductive adhesive or epoxy, such as "LOCTITE-384" produced by Loctite Corp. However, if an adhesive is used to attach the heat sink, the heat sink is difficult to detach.

Detachable heat sinks are desirable in applications where it is necessary to remove damaged or defective packages. For example, packages which comprise solder balls as second level interconnects, referred to as "ball grid array" (BGA) packages, may only be removed from a wiring board by heating the solder balls to a melting temperature of the solder (reflow temperature). If the package has a non-detachable heat sink, more heat is required to melt the solder balls since the heat sink absorbs most of the heat provided due to high thermal capacitance of the heat sink material. The high intensity heat necessary to melt the solder balls causes damage, in many cases, to surrounding components on the wiring card. A detachable heat sink, however, provides easy access to the defective package by removing the heat sinks before providing sufficient heat to melt the solder balls. Therefore, less heat is required, compared to a non-detachable heat sink package, to melt the solder balls.

Some packages have heat sinks which are attached with screws. The screws extend from the heat sink into the substrate. These packages require a sufficiently thick substrate to support the screws, which in many applications is undesirable.

Figure 2A:
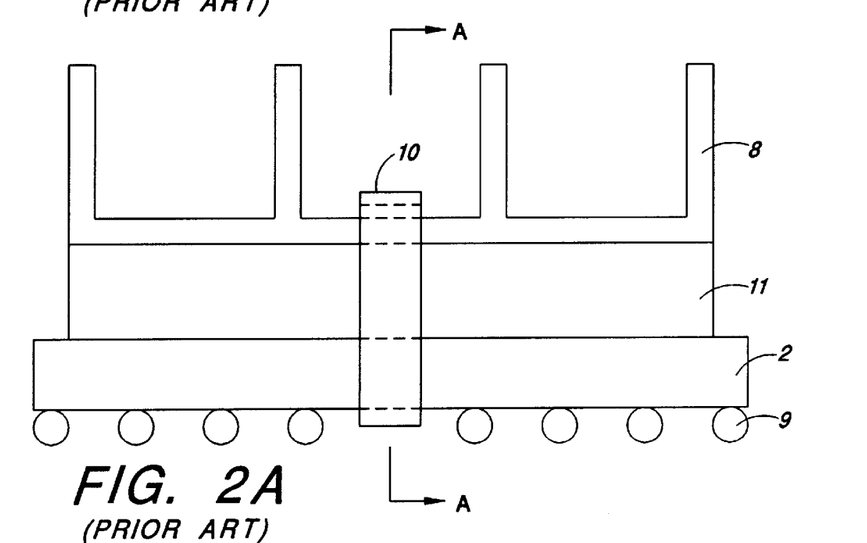
FIG. 2a is a side view of an electronic semiconductor device package with a heat sink attached by a clip.
Figure 2B:
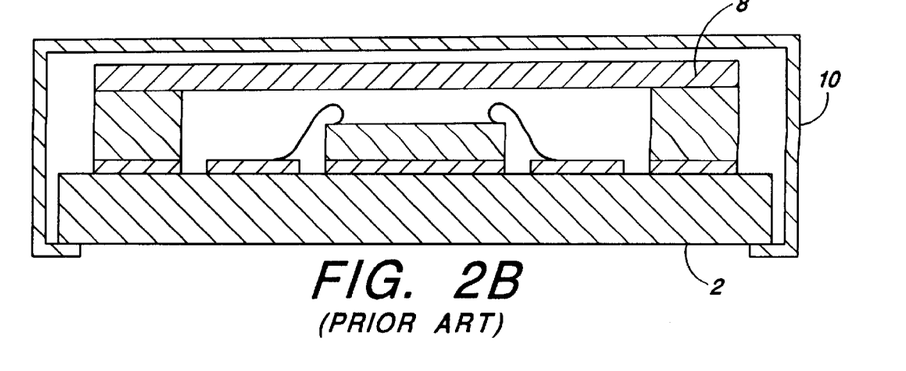
FIG. 2b is a cross-section of the electronic semiconductor device package shown in FIG. 2a across line A—A.
Figure 3A:
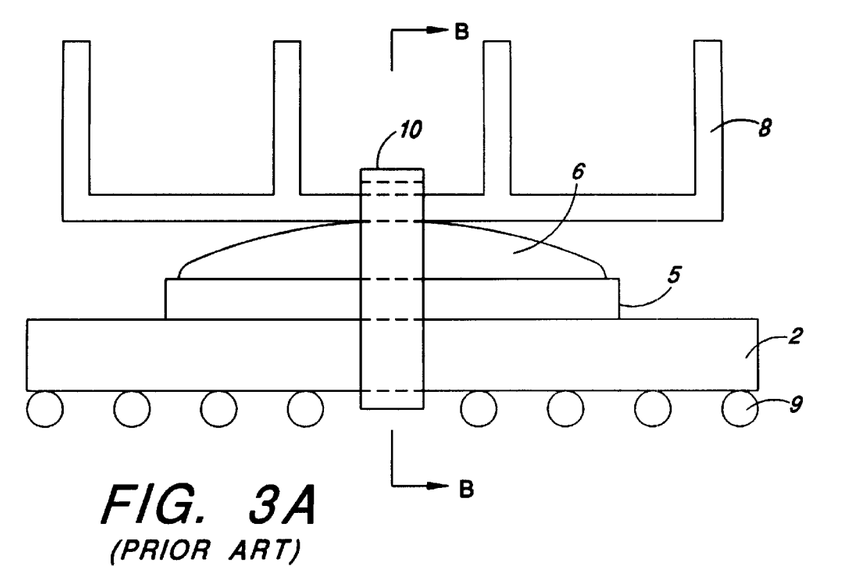
FIG. 3a is a side view of a "glob-top" electronic semiconductor device package with a heat sink attached by a clip.
Figure 3B:
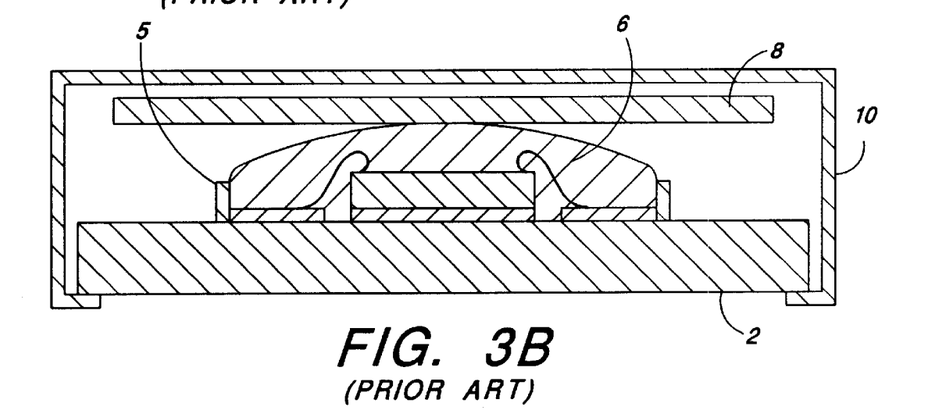
FIG. 3b is a cross-section of the electronic semiconductor device package shown in FIG. 3a across line B—B.

Alternatively, as shown in FIGS. 2a and 2b, a clip attachment device is shown for attaching a heat sink to an electronic semiconductor package. FIG. 2b is a cross-sectional view of the embodiments shown in FIG. 2a across line A—A. The clip 10 extends from one side of the semiconductor chip package to the other. In particular, the ends of the clip 10 curve around the edges of the package to engage the underside of the substrate 2. However, in this configuration, the clip 10 interferes with the solder balls 9 so that fewer input/output solder balls are available for use. Further, as shown in FIGS. 3a and 3b, in packages which employ a dam ring 5, the encapsulant 6 forms a mound over the die. FIG. 3b is a cross-sectional view of the embodiment shown in FIG. 3a across line B—B. These are called "glob-top" packages. The heat sink 8 only contacts the package at the top of the encapsulant 6 in the center of the package. The ends of the clip pull the edges of the substrate in the opposite direction to the force exerted by the heat sink 8 on the encapsulant 6. This generates a significant bending moment in the substrate.

Regardless of whether a package employs a stiffener or a dam ring, this method of clipping adds additional stress to the package substrate which warps the semiconductor package. This warpage is most significant in "glob-top" packages. Further, the clip, which wraps around and engages the edge of the substrate, interferes with the second level interconnects. This interference is particularly detrimental in the case of a ball grid array package.

Therefore, there is a need for a detachable heat sink attachment device which does not generate additional warpage of the package or interfere with the second level interconnects.

SUMMARY OF THE INVENTION

In accordance with one embodiment of the invention, there is provided a stiffener with integrated heat sink attachment clips for attaching the heat sink to the package. This stiffener supports the package to reduce or prevent package warpage and prevents the attachment clip from interfering with second level interconnects. In particular, the removable clip-on heat sink is easily attached to the package top surface by snapping the heat sink into the clips on the stiffener. Since clips are provided on each side of the stiffener, directional independent attachment of the heat sink is possible. Also, since the heat sink is not directly clipped to the thin package substrate, there is less bending moment and stress on the package edge. The invention therefore allows greater latitude in the design of the substrate because thinner substrates are possible and traces at the bottom surface of the package substrate may be extended to the very edge of the substrate without interference by a clip.

According to an additional aspect of the invention, there is provided an electronic semiconductor device package, the package comprising: a substrate having traces; a die attached to the substrate; first level interconnects of the die to the traces of the substrate; and a stiffener attached to the substrate, wherein the stiffener comprises at least one clip.

According to a still further aspect of the invention, there is provided a system for attaching a heat sink to an electronic semiconductor device package, the system comprising: a stiffener of the electronic package which is attachable to the electronic package; and at least one clip that is integral with the stiffener and secures the heat sink to the stiffener.

According to an alternative aspect of the invention, there is provided a method of detachably attaching a heat sink to an electronic semiconductor device package, the method comprising: attaching a stiffener to the package, wherein the stiffener comprises at least one clip; positioning a heat sink adjacent the stiffener; and engaging the clip with the heat sink, wherein the heat sink is secured to the stiffener by the clip.

The stiffener of the invention may be employed in connection with any existing or contemplated electronic systems including integrated circuit devices and semiconductor devices with or without packages, multi-chip modules, flip-chip devices, substrate structures and other forms of electronic component devices and systems that benefit from being cooled.

BRIEF DESCRIPTION OF THE DRAWINGS

The present invention is better understood by reading the following description of nonlimitative embodiments, with reference to the attached drawings wherein like parts in each of the several figures are identified by the same reference character, and which are briefly described as follows.

FIG. 4b is a side view of the stiffener shown in FIG. 4a.

FIG. 5b is a side view of the stiffener shown in FIG. 5a.

FIG. 11b is a side view of the embodiment of the invention shown in FIG. 11a.

It is to be noted, however, the appended drawings illustrate only typical embodiments of this invention and are therefore not to be considered limiting of its scope, as the invention may admit to other equally effective embodiments.

DETAILED DESCRIPTION OF THE INVENTION

Figure 4A:
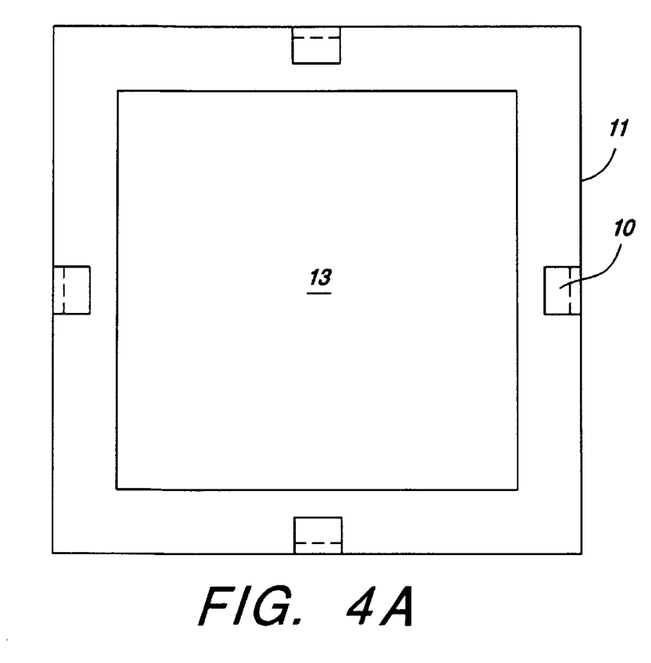
FIG. 4a is a top view of one embodiment of the stiffener.
Figure 4B:
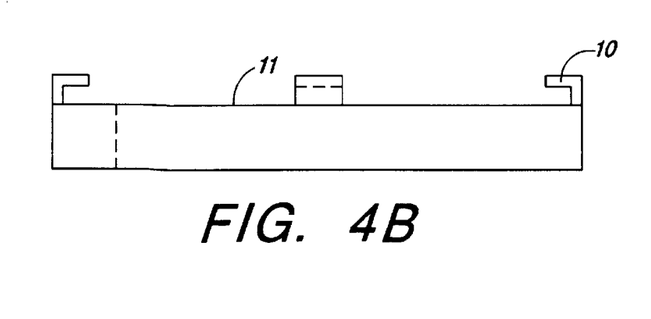

Referring to FIGS. 4a and 4b, an embodiment of the stiffener of the present invention is shown. FIG. 4a is a top view of the stiffener, while FIG. 4b is a side view. In this embodiment, the stiffener 11 has integrated clips 10 centrally located along each edge of the stiffener 11. Further, the stiffener 11 has an opening 13 for encapsulant. In this configuration, the stiffener 11 functions as a dam ring of the encapsulant which is placed in the opening 13. The stiffener 11 is sufficiently thick and wide to support the semiconductor package to reduce or prevent package warpage. The clips 10 in this embodiment extend from the top of the stiffener 11. Clips may be placed at different locations, and the number of clips may also change.

Figure 5A:
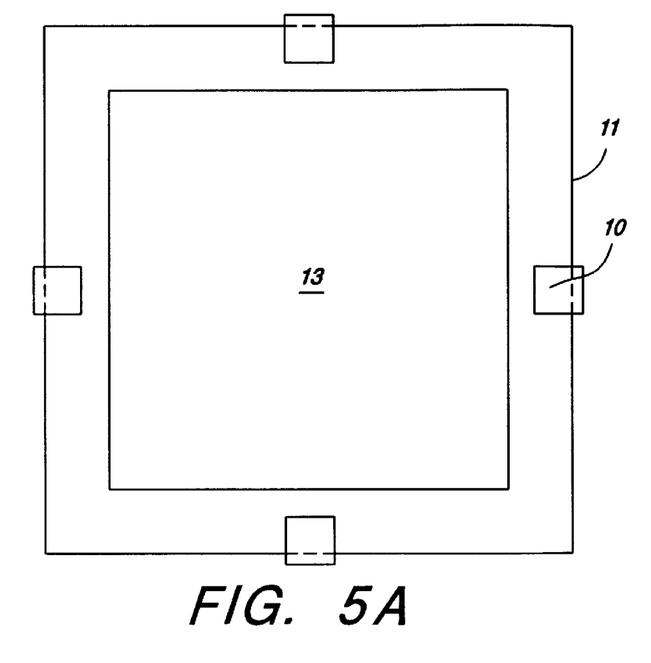
FIG. 5a is a top view of one embodiment of the stiffener.
Figure 5B:
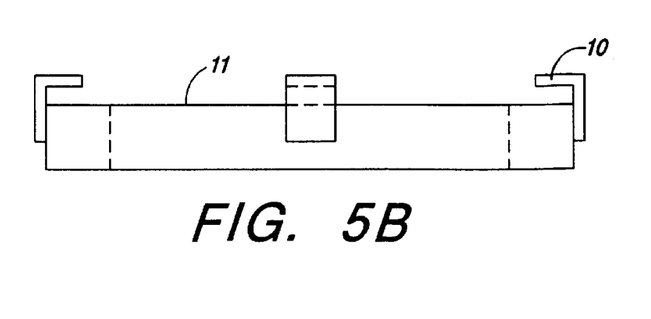

Referring to FIGS. 5a and 5b, an alternative embodiment of the invention is shown. This embodiment is similar to the one shown in FIGS. 4a and 4b except the clips 10 do not extend from the top of the stiffener 11. Rather, the clips 10 extend from the sides of the stiffener. This embodiment allows for attachment of a heat sink which has the same outside diameter as the stiffener 11.

The heat sink attachment stiffener of the present invention is used with any electronic device or system which benefits from being cooled. In particular, the stiffener is used with electronic semiconductor packages which comprise: a silicon chip (die), reference character 1 in FIG. 7b; a substrate 2; first level interconnects 4 which connect the die 1 to the traces 3 of the substrate 2; and second level interconnects 9 which connect the substrate 2 to printed wiring circuit cards, not shown. The die is attached to the substrate by any known means such as silver-filled epoxy, solder or epoxy 1a. The substrate comprises upper conductive traces 3 which electrically connect to lower conductive traces by electrically conductive vias. The vias pass through the substrate to complete the connection between the first level interconnects and second level interconnects. In some embodiments, the semiconductor device package comprises any first level interconnect device known to those of skill, such as wirebonds, Tape Automated Bonds (TAB) and Controlled Collapse Chip Connection (C4 or flip chip bonds). Embodiments of the package also comprise known second level interconnects, such as external metal pins or solder balls. Electronic semiconductor device packages also comprise encapsulant 6 which coats the die 1 and the first level interconnects 4 for protection. With the encapsulant 6, the package is sometimes referred to as a "glob-top" package.

Figure 7A:
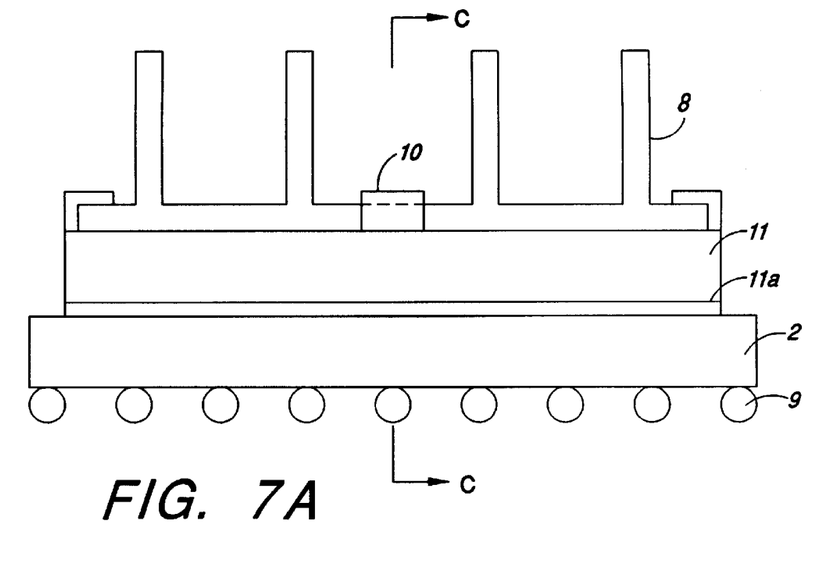
FIG. 7a is a side view of a semiconductor chip package with a heat sink attached to a stiffener by integrated clips.
Figure 7B:
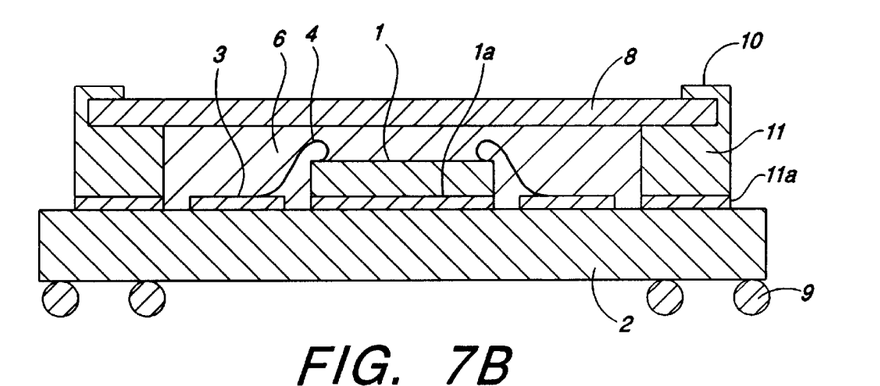
FIG. 7b is a cross-section of the electronic semiconductor device package shown in FIG. 7a across line C—C.

Referring to FIGS. 7a and 7b, an electronic semiconductor package is shown with an attached heat sink. FIG. 7b is a cross-sectional view of the semiconductor package shown in FIG. 7a across line C—C. For purposes of discussion, the die 1 of the semiconductor package is attached by wire bond first level interconnects 4 to the traces 3 of the substrate 2. However, the present invention may be used with any semiconductor package configuration. An embodiment of the stiffener 11 is attached to the substrate 2 and surrounds the die 1 and bond wires 4. The stiffener 11 also serves as a dam ring to enclose encapsulant 6 in the opening 13 (see FIG. 4a) of the stiffener 11. A heat sink 8 is adjacent the encapsulant 6 and the stiffener 11. The heat sink 8 is secured in place by integrated clips 10 which extend from the stiffener 11. The ends of the clips 10 are curved around the outside edges of the heat sink 8.

Figure 6:
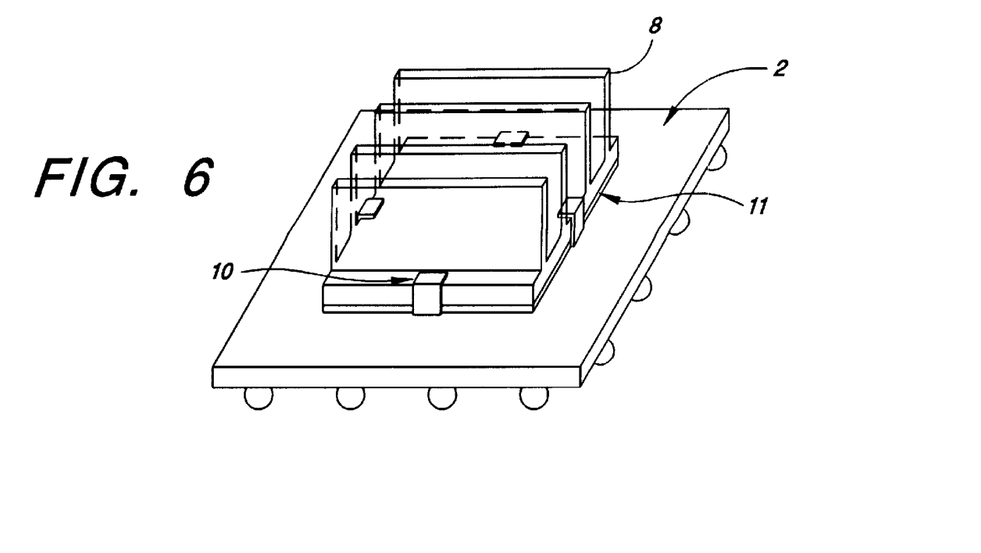
FIG. 6 is a perspective view of a stiffener attached to a package substrate and a heat sink attached to the stiffener by integrated clips.

A package is assembled by first attaching the die 1 to the substrate 2. Next, the first level interconnects 4 are secured to electrically connect the pads on the die 1 to the upper traces 3 on the substrate 2. A stiffener 11 is then attached to the substrate 2 and liquid encapsulant 6 is poured over the die 1 and first level interconnects 4 within the stiffener 11. The encapsulant 6 is allowed to solidify by a curing process. Second level interconnects 9 are attached to the bottom surface of the package substrate 2. Next, a tool is used to spread the clips 10 radially outward, away from die in the center of the package. Then, a heat sink 8 is placed adjacent the stiffener 11 and the encapsulant 6 and the clips 10 are released to spring back around the peripheral edges of heat sink 8. The complete package is shown in FIG. 6.

Because the stiffener 11 also functions as a dam ring, there is no need to use a dam ring during the encapsulation process. As encapsulant is poured into the opening of the stiffener 11, the stiffener pools the encapsulant. A suitable encapsulant is found in an epoxy, such as Hysol FP4450, produced by Dexter Corp. If the encapsulant is filled to the top of the stiffener, a uniform surface is created which extends from one upper edge of the stiffener, across the encapsulant and finally to the opposite upper edge of the stiffener. This controlled encapsulant process provides a flat surface interface for complete interaction with the heat sink. The thermal connection is further improved by a layer of thermally conductive material, e.g., silicone grease or paste. One suitable grease is "OMEGATHERM" produced by Omega Corporation. Alternatively, a thermal tape, such as "T-Flex" produced by Thermagon, Inc., may be used.

Finally, the thermally conductive material may be a phase change material, which is solid while the package is cool, but liquid as the package heats up. One phase change material is "T-Pli 205-AO" also produced by Thermagon, Inc. The thermally conductive material fills gaps between the encapsulant and the heat sink.

In an alternative stiffener embodiment, several clips 10 are located along a single edge of the stiffener 11. This provides more stability and rigidity between the stiffener 11 and the heat sink 8. In other embodiments, heat sink 8 comprises notches into which the clips extend. A heat sink with notches could be used with the stiffener shown in FIGS. 4a and 4b. Because the clips 10 protrude from the top of the stiffener 11, notches allow the clips 10 to extend upward, around the edge of the notch, and over the top of the base member of the heat sink. Thus, the remaining edge portions of the heat sink which are not proximate the clips may extend all the way to the edge of the stiffener. Because there is more contact area between the stiffener and the heat sink, the conduction path of this embodiment is improved. Further, the width of each notch is only slightly greater than the width of each clip 10. This stabilizes the heat sink against lateral movement.

While the embodiments of the stiffener 11 shown in the figures are rectangular, alternative stiffeners are disc shaped or shaped similar to the semiconductor device package. In different embodiments, the stiffener is made of powdered metal or thermally-conductive material such as aluminum, copper, copper/tungsten, plastic or any other known material. The stiffener 11 and clips 10 are made of a spring like material so the clips 10 provide enough pressure to hold the heat sink 8 in place.

Any heat sink configuration known in the art may be used in conjunction with the stiffener of the present invention. Examples of heat sink configurations include: pin, fin and ducted heat sinks. The pin configurations provide a plurality of parallel cooling fins which rise vertically from a horizontal surface or base member. The pins themselves comprise various cross-sections and longitudinal shapes. The fin heat sinks have vertical fins, of many possible cross-sections, which rise from a horizontal base member. The ducted heat sinks comprise a horizontal top member which is attached to the pins or fins opposite the horizontal base member. Embodiments of the heat sink are formed with powdered metal or thermally-conductive material such as aluminum, copper, copper/tungsten, plastic or any other known material.

The stiffener 11 is attached to the substrate 2 by any means known to those of skill in the art. For example, in one embodiment, the stiffener 11 is attached by a known silicone-based epoxy disposed between the bottom surface of the stiffener 11 and the upper surface of the substrate 2. Alternatively, the stiffener 11 is attached to the substrate by double sided adhesive tape also known in the art. Further, the stiffener 11 is attached by screws which extend into both the stiffener and the substrate. In a still further embodiment, the stiffener 11 is attached to the substrate 2 by the encapsulant 6 itself. This embodiment is described in greater detail with respect to FIG. 8.

Figure 8:
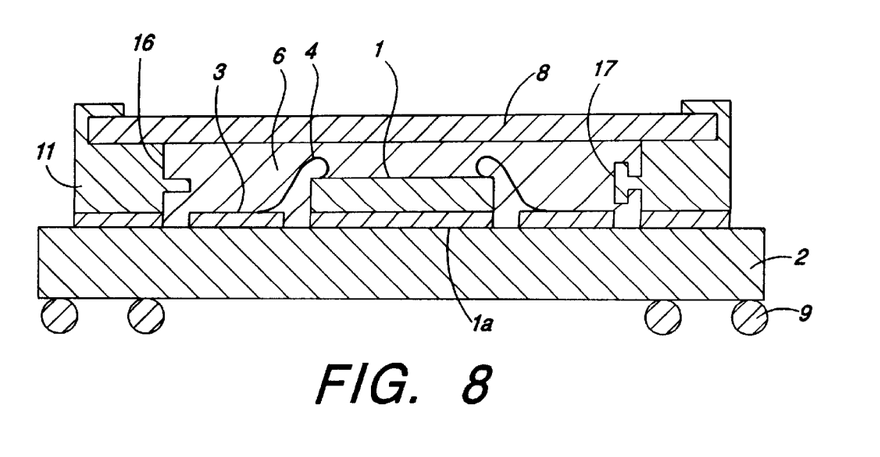
FIG. 8 is a cross-section of a stiffener embodiment of the invention comprising protrusions for anchoring the stiffener to the encapsulant.

As shown in FIG. 8, the stiffener 11 is provided with a protrusion 16 which extends into the interior of the stiffener 11 toward the die 1. During the encapsulation process, encapsulant 6 flows around the protrusion 16 and, once hardened, secures the stiffener 11 to the substrate 2. Numerous suitable protrusions will occur to those of skill in the art. For example, in one embodiment, the protrusion 16 comprises a single protrusion which extends around the entire circumference of the opening 13 (see FIG. 4a) for the encapsulant 6. Alternatively, the protrusion 16 comprises separate, individual protrusions which are located at various points around the opening. Additionally, as shown in FIG. 8, some embodiments of the protrusion 16 comprise ridges 17 at the distal end of the protrusion 16 which extend above and below the protrusion to ensure engagement between the protrusion 16 and the encapsulant 6.

Figures 9, 10, 11C, 11D:
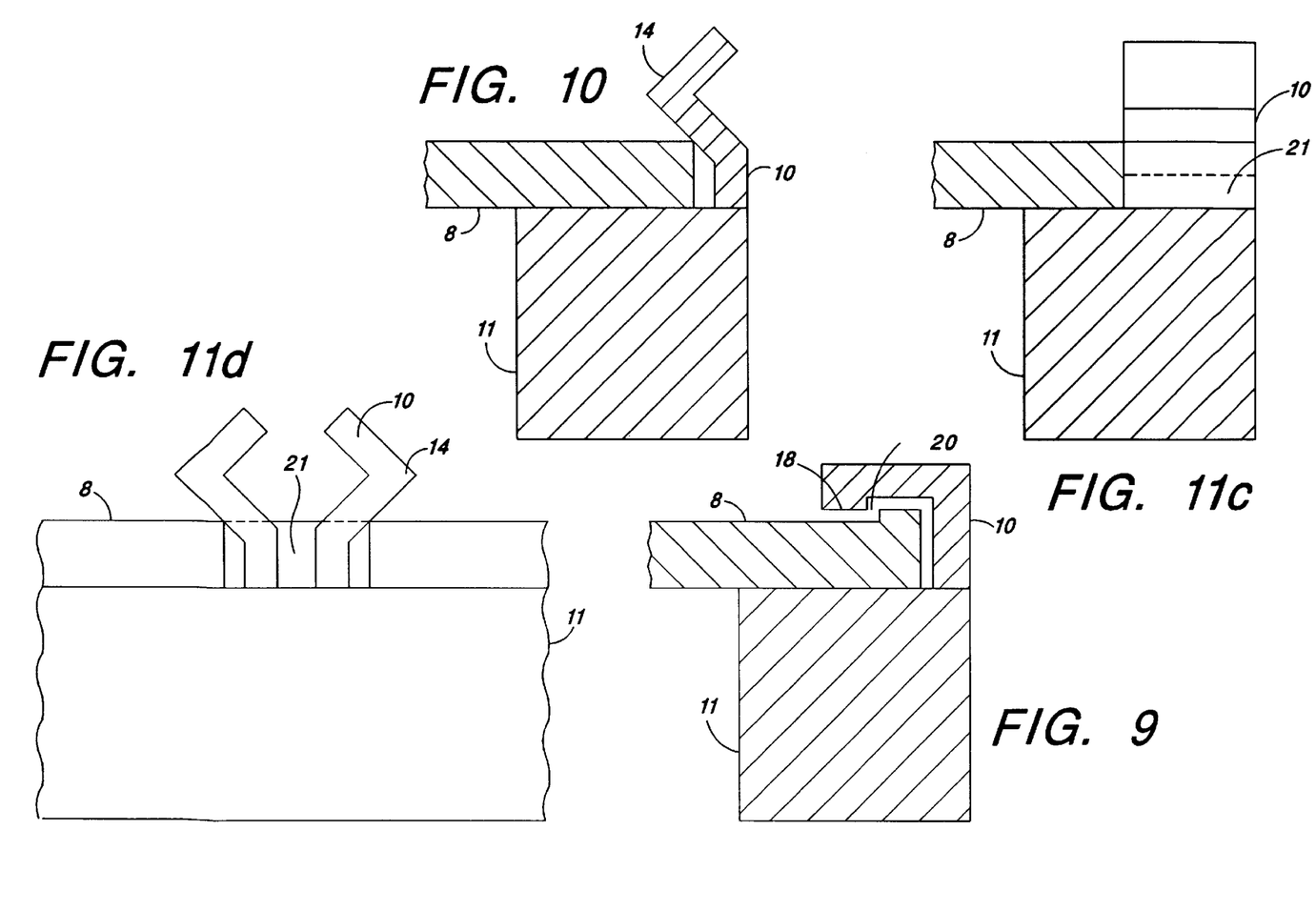
FIG. 9 is a cross-section of a portion of a heat sink and a stiffener with an integrated up-side-down "J" clip embodiment of the invention.
FIG. 10 is a cross-section of a portion of a heat sink and a portion of a stiffener with an integrated clip comprising an elbow bend.
FIG. 11c is a cross-section view of a portion of the heat sink and a portion of the stiffener comprising a set of oppositely faced elbow bend clips.
FIG. 11d is a side view of the heat sink and stiffener portions shown in FIG. 11c.

Referring to FIG. 9, the drawing shows a cross-sectional side view of an embodiment of the invention. The clip 10 comprises a short up-side-down "J". The heat sink 8 has a ridge 20 which extends upwardly from the inside edge of the heat sink 8. The clip 10 is shaped like an up-side-down "J" so as to extend from the upper surface of the stiffener 11, around the ridge 20 which extends from the edge of the heat sink and down again on the backside of the ridge 20. The end of the clip 10 is a ridge 18. The clip ridge 18 extends over and hooks behind ridge 20 on the heat sink 8. The ridges prevent the clip 10 from prematurely disengaging from the heat sink 8. Depending on the particular embodiment, any number of J-clips 10 are used to secure the heat sink 8 to the stiffener 11.

Referring to FIG. 10, an embodiment of the invention is shown with an alternative clip. In this embodiment the clip 10 comprises an elbow bend 14 which extends upward from the stiffener, inwardly toward the heat sink 8, and then outwardly away from the heat sink 8. A similarly shaped clip is positioned opposite the clip 10 shown in the figure and has its elbow bend facing the opposite direction so the elbow bends of both clips extend toward the middle of the stiffener. The clips 10 are made of a material which allows the clips to elastically deform as the heat sink 8 is placed on the package. The elbow bends 14 are pushed outwardly away from each other as the heat sink 8 is positioned over the stiffener 11. Once in position, the elbow bends 14 spring toward each other and to wrap around opposite ends of the heat sink 8. This embodiment allows the heat sink 8 to be more easily attached and removed.

An alternative embodiment comprises a stiffener which, at one end, comprises a clip 10 with a straight end which protrudes directly around the edge of the heat sink 8, as shown in FIG. 7b, while, at the opposite end, the stiffener comprises a clip 10 with an elbow bend, as shown in FIG. 10.

Figure 11A:
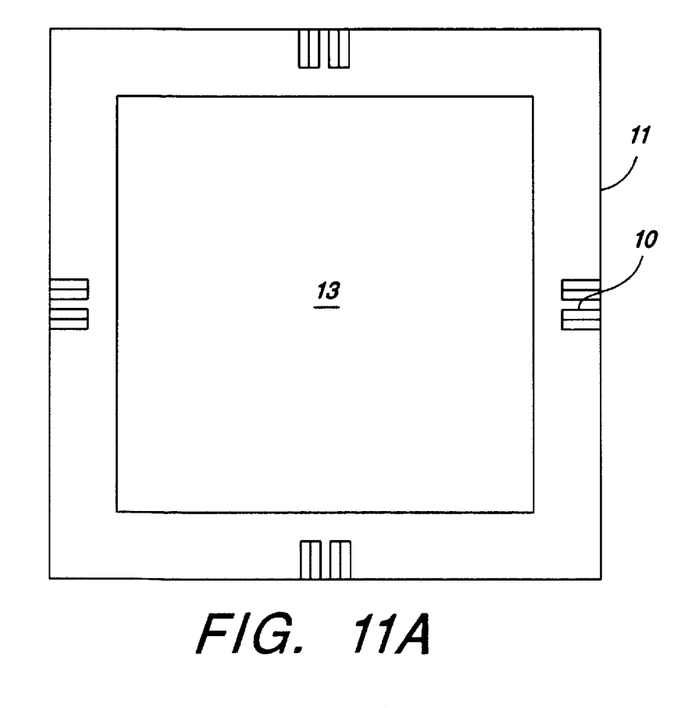
FIG. 11a is top view of a stiffener comprising sets of oppositely faced elbow bend clips.
Figure 11B:
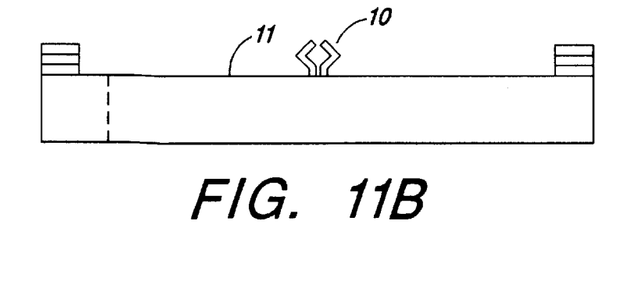

Referring to FIGS. 11a through 11d, an embodiment of the stiffener is shown with sets of oppositely facing clips. FIG. 11a is a top view of the stiffener 11 and FIG. 11b is a side view. The stiffener 11 has four sets of clips 10, one set per side. Each set of clips comprises two elbow bend clips 10 which are positioned opposite to each other with the elbow bends facing toward the outside. As shown in FIG. 11b, the clips 10 are positioned on the stiffener perpendicular to the clips of the previously discussed embodiments. FIGS. 11c and 11d are larger side and end views, respectively, of a set of clips 10 with a heat sink 8 secured thereby. The heat sink 8 has a notch 21 at its edge for receiving the clips 10. When the heat sink 8 is attached to the stiffener, the elbow bend clips 10 are bent toward each other until the heat sink 8 passes the ends of the elbows on the clips 8. As the heat sink 8 comes to rest on the stiffener 11, the clips 10 spring away from each other. The elbow ends of the clips extend over the edges of the notch in the heat sink to secure the heat sink 8. While four sets of clips are shown in the figures, any number of sets are possible.

Figure 12:
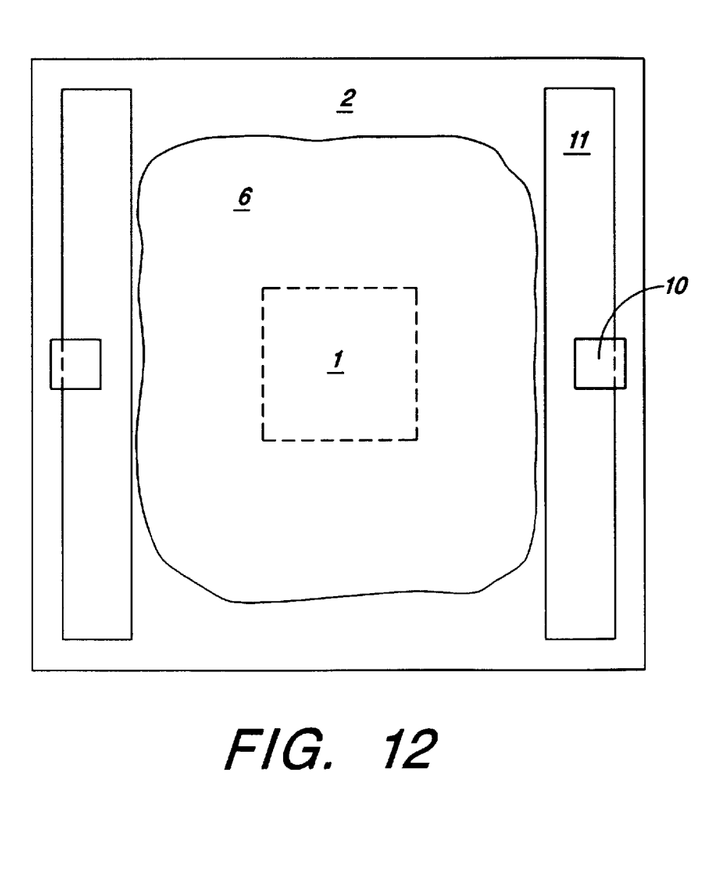
FIG. 12 is a top view of a "glob-top" electronic semiconductor package with two stiffeners.

Referring to FIG. 12, a top view of an embodiment of the invention is shown wherein two stiffeners are attached to the semiconductor package. Again, the semiconductor chip package comprises a substrate 2. The die 1 is attached to the substrate 2 in a central location. A mound of encapsulant or "glob-top" 6 covers the die 1 and the central portion of the substrate 2. Two individual stiffeners 11 are attached to opposite ends of the package. Each of the stiffeners 11 has a clip 10 which faces inwardly. Similar to the previous embodiments, a heat sink, not shown, is attachable to the stiffeners 11 by the clips 10. When the heat sink is attached to the stiffeners 11, a gap exists between the substrate and the perimeter of the heat sink where the heat sink is not supported by the stiffeners 11. Therefore, one heat sink which could be used with the two stiffener configuration comprises steps at opposite sides of the heat sink. The steps extend from the bottom surface of the heat sink to the substrate at the perimeter of the heat sink where it is not supported by the stiffeners. Of course, it is important that the step be placed at the perimeter so as not to interfere with the encapsulant 6. This improves the thermal conduction path between the substrate and the heat sink.

Figure 13:
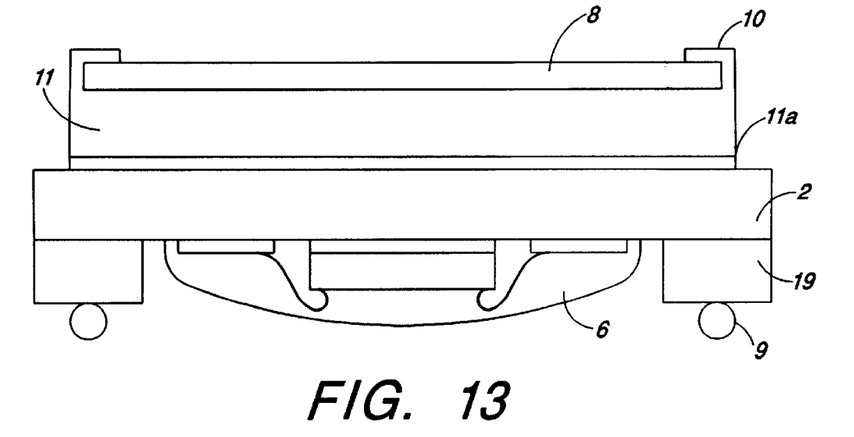
FIG. 13 is a side view of a stiffener embodiment of the invention attached to a cavity down semiconductor device package.

Referring to FIG. 13, a cross-section of a cavity-down semiconductor package is shown. The components of the cavity-down package are similar to the cavity-up configurations previously discussed, except the die and first level interconnects are positioned on the underside of the substrate, i.e, the side which faces the printed wiring board. Also, additional lamination layers 19 may be added to the substrate to support the second level interconnects. In this embodiment, the stiffener 11 does not require an opening for encapsulant because the die 1 is on the opposite side of the substrate. As before, the stiffener 11 is provided with clips 10. This allows the heat sink 8 to be firmly attached to the stiffener 11 by the clips 10.

Figure 14:
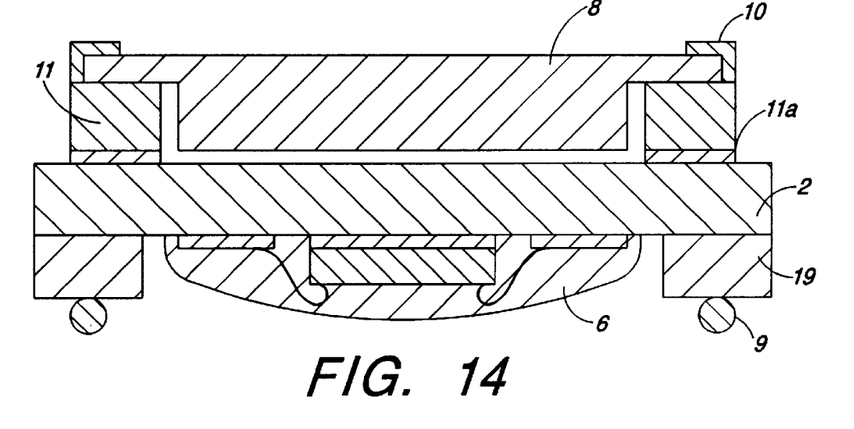
FIG. 14 is a cross-section view of an alternative embodiment of the invention attached to a cavity down electronic semiconductor device package.

Referring to FIG. 14, an alternative embodiment of the invention for attaching a heat sink to a cavity down semiconductor package is shown in cross-section. In this embodiment, the stiffener 11 comprises an opening similar to the opening 13 shown in FIG. 4a. However, rather than filling the interior of the opening with encapsulant, the heat sink 8 protrudes into the opening. As before, clips 10 secure the heat sink 8 to the semiconductor chip package. As with all of these embodiments, thermal grease or double sided thermally conductive tape is applied between the heat sink 8 and the substrate 2 to improve the thermal conductivity of the pathway.

Figure 15:
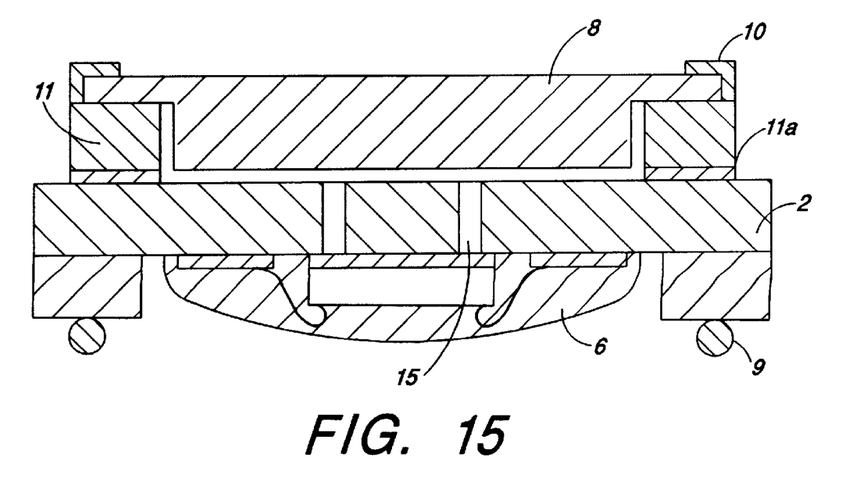
FIG. 15 is a cross-section view of an alternative embodiment of the invention attached to a cavity down electronic semiconductor device package wherein the substrate comprises thermally conductive vias.

As shown in FIG. 15, a further embodiment of the invention comprises thermally conductive vias. The vias 15 extend through the substrate 2 from the die 1 to the heat sink 8. The vias 15 are filled with a thermally conductive material, such as copper, silicon carbide or aluminum nitride, which provides a path for thermal conduction through the substrate from the die to the heat sink 8. Alternatively, the vias 15 comprise a large single via approximately the same size width as the die.

While the particular embodiments for electronic semiconductor device packages as herein shown and disclosed in detail are fully capable of obtaining the objects and advantages herein before stated, it is to be understood that they are merely illustrative of the presently preferred embodiments of the invention and that no limitations are intended by the details of construction or design herein shown other than as described in the appended claims.

I claim:

1. An electronic semiconductor device package, said package comprising:

a substrate having traces;

a die attached to said substrate;

first level interconnects electrically coupling said die to the traces of said substrate;

a stiffener attached to said substrate, wherein said stiffener comprises at least one J shaped clip having a ridge; and a heat sink having a ridge adjacent to said stiffener, wherein the ridge of the J shaped clip of said stiffener engages the ridge of the heat sink to secure said heat sink to said stiffener.

2. An electronic semiconductor devise package, said package comprising:

a substrate having traces;

a die attached to said substrate;

first level interconnects electrically coupling said die to the traces of said substrate; and a stiffener attached to said substrate, wherein said stiffener comprises at least one clip, wherein said clip comprises a set of oppositely facing elbow clips.

3. A package as in claim 2, wherein said stiffener comprises a shape similar to said substrate.

4. A package as in claim 2, wherein said stiffener comprises an opening for encapsulant, whereby the stiffener functions as a dam ring.

5. A package as in claim 2, further comprising a plurality of stiffeners, wherein each stiffener of said plurality is attached to the substrate.

6. A package as in claim 5, wherein each stiffener of said plurality comprises at least one clip.

7. A package as in claim 2, further comprising:

a heat sink adjacent said stiffener, wherein the clip of said stiffener engages the heat sink to secure said heat sink to said stiffener.

* * * * *